US007414652B2

(12) United States Patent
Shinotsuka

(10) Patent No.: US 7,414,652 B2
(45) Date of Patent: Aug. 19, 2008

(54) IMAGE SENSOR AND METHOD

(75) Inventor: Sukeyuki Shinotsuka, Saitama (JP)

(73) Assignee: Honda Giken Kogyo Kabushiki Kaisha, Minato-Ku, Tokyo (JP)

( * ) Notice: Subject to any disclaimer, the term of this patent is extended or adjusted under 35 U.S.C. 154(b) by 803 days.

(21) Appl. No.: 10/729,577

(22) Filed: Dec. 3, 2003

(65) Prior Publication Data

US 2004/0169755 A1 Sep. 2, 2004
US 2007/0273780 A9 Nov. 29, 2007

Related U.S. Application Data

(63) Continuation of application No. PCT/JP02/03481, filed on Apr. 8, 2002.

(30) Foreign Application Priority Data

Jun. 6, 2001 (JP) ............................ 2001-209983
Jun. 6, 2001 (JP) ............................ 2001-209985

(51) Int. Cl.
*H04N 3/14* (2006.01)

(52) U.S. Cl. ...................................... 348/294; 348/308

(58) Field of Classification Search ................. 348/308, 348/307, 310, 304, 302, 297, 241, 242, 298, 348/294; 250/208.1, 208.3; 382/312
See application file for complete search history.

(56) References Cited

U.S. PATENT DOCUMENTS 4,899,220 A * 2/1990 Basile et al. ................ 348/584
5,933,189 A * 8/1999 Nomura ...................... 348/302
5,998,778 A * 12/1999 Kimata .................... 250/208.1
5,999,211 A * 12/1999 Hedges et al. ............. 348/144
6,531,266 B1 * 3/2003 Chang et al. ................ 430/321
6,665,010 B1 * 12/2003 Morris et al. ............... 348/297
6,687,026 B1 * 2/2004 Steinebach .................. 358/483
6,731,266 B1 * 5/2004 Jung .......................... 345/103
6,868,231 B2 * 3/2005 Irving et al. ................ 396/322
6,975,355 B1 * 12/2005 Yang et al. .................. 348/308
6,999,120 B1 * 2/2006 Egawa et al. ................ 348/296
7,092,021 B2 * 8/2006 Fossum et al. .............. 348/305
7,151,566 B2 * 12/2006 Hattori et al. ............... 348/254
7,176,435 B2 * 2/2007 Shinotsuka et al. ...... 250/214 L
2006/0268143 A1 * 11/2006 Boettiger et al. ............ 348/340

FOREIGN PATENT DOCUMENTS

JP 2000-329616 11/2000

* cited by examiner

*Primary Examiner*—Tuan Ho
*Assistant Examiner*—Amy Hsu
(74) *Attorney, Agent, or Firm*—Fulbright & Jaworski

(57) ABSTRACT

An image sensor comprising a matrix of solid-state light sensor elements each representing a unit pixel, which is capable of reading out sensor signals from respective pixels in a time series by sequentially selecting pixels on a line-by-line basis and sequentially selecting pixels in a selected line, wherein each pixel line is divided into a plurality of blocks with each block composed of the same specified number of pixels and a first scanning means sequentially reads pixel sensor signals on the block-by-block basis starting from the first block and a second scanning means reads pixel sensor signals of the readout block. The image sensor thus constructed can achieve high speed scanning of respective pixels with a minimal increase in power consumption.

7 Claims, 16 Drawing Sheets

IMAGE SENSOR AND METHOD

BACKGROUND OF THE INVENTION

The present invention relates to an image sensor comprised of a number of solid-state light sensor elements arranged to form a matrix of the light sensor elements each representing a unit pixel, wherein sensor signals from respective pixels are read out (scanned) in a time series by sequentially selecting the pixel lines one at a time and sequentially selecting each of the pixels in a selected line.

Japanese Laid-Open Patent Publication No. 2000-329616 discloses a conventional image sensor, in which a light sensor circuit representing a unit pixel comprises, as shown in FIG. 1, a photo-diode PD operating as a photoelectric converting element for producing therein a sensor current proportional to the quantity of incident light Ls falling thereon, a transistor Q1 having a logarithmic output characteristic in a weak inverse state for converting the sensor current produced in the photodiode PD into a voltage signal Vpd by using the property of its sub-threshold region, a transistor Q2 for amplifying the voltage signal Vpd and a transistor Q3 for outputting a sensor signal So in accordance with a timing pulse of a readout signal Vs and which is characterized by its wide dynamic range obtained by giving the output a logarithmic characteristic, thereby achieving the high sensitivity of detecting a light signal. This image sensor can change drain voltages of the transistors for all pixels from a normal to a lower level for a specified time to remove charges accumulated in parasitic capacitors C of respective photoelectric converting elements, thereby initializing all pixels before detecting light signals. Therefore, even if the sensor current rapidly decreased with a decreased illumination, each sensor circuit may immediately obtain a voltage signal corresponding to the incident light quantity at that moment, thereby eliminating the possibility of occurrence of afterglow of the pixel at a decreased quantity of incident light.

FIG. 2 shows a time chart of signals produced at respective portions of the light sensor circuit of FIG. 1. In FIG. 2, t1 is an initializing timing pulse, t2 is a timing pulse for outputting a light sensor signal So and T designates a period for accumulating a charge in a parasitic capacitor C of the photodiode PD.

FIG. 3 shows an output characteristic of a sensor signal So with a sensor current proportional to a quantity of light falling on the light sensor circuit of FIG. 1, which is characterized by a logarithmic output characteristic at a sufficient quantity of the sensor current flowing in the photodiode PD and by a non-logarithmic linear characteristic at a small quantity of the sensor current due to a response delay in charging a parasitic capacitor C. In FIG. 3, WA indicates a non-logarithmic response characteristic region and WB indicates a logarithmic response characteristic region.

FIG. 4 shows an exemplary construction of a conventional image sensor comprising a number of the above-described light sensor circuits arranged to form a matrix of pixels (i.e., light sensor circuits), wherein sensor signals from respective pixels are read by scanning in a time series.

The image sensor is composed of 4×4 pixels D11-D44 arranged in a matrix of pixel circuits, in which, under control of an electronic control unit ECU (not shown), pixel lines are selected one by one with respective selecting signals LS1-LS4 sequentially output from a pixel line selecting circuit 1 and pixels in each selected pixel-line are readout one by one as respective sensor signals So in such a manner that selecting signals DS sequentially output from a pixel selecting circuit 2 turn ON corresponding switches SW1-SW4 to read sensor signals So in a time series. Each of the sensor signals So sequentially readout from respective pixels is converted into a specified voltage signal Vo by applying a bias voltage Vcc through a reference resistance R. In FIG. 4, numeral 4 designates a power source for gate voltage VG of the transistor Q1, numeral 6 designates a power source for a drain voltage VD of the transistor Q1 and numeral 5 designates a voltage switching-over circuit 5 by which a drain voltage VD of each transistor Q1 for each pixel is changed to a normal high-level H or an initializing lower level L by the effect of a specified timing pulse.

FIG. 5 is a time chart of signals generated at respective portions of the thus constructed image sensor. However, the above-described conventional image sensor has a low signal driving ability to convert a sensor signal So from each pixel into an output voltage signal Vo and output it. In other words, if the image sensor reads out a sensor signal at an increased scanning speed, the voltage signal Vo would be output as unsaturated. For this reason, it cannot achieve high speed reading-out (scanning) of pixel signals.

To improve the signal driving ability of the conventional image sensor, it is modified by providing each pixel output of one pixel line with a bias circuit 11 which, as shown in FIG. 6, converts each sensor signal So read from each of respective pixels in a pixel line into a voltage signal Vo by applying a bias voltage Vcc through a reference resistance. This modification makes it possible to read out pixel signals at an increased scanning speed but, at the same time, increases power consumption for supplying electric current to a number of reference resistances R provided for each of the pixel outputs of each pixel line. High speed scanning is still difficult since the capacities of a plurality of analog switches (transistor switches) must be driven until a voltage signal Vo of the pixel selected by the pixel selecting circuit 2 is output.

Accordingly, an attempt has been made to improve signal driving ability of the image sensor by further providing a buffer circuit 12 which comprises, as shown in FIG. 15, buffer amplifiers BF connected to each one of the signal lines on the output side of the bias circuit 11 and which can temporally and intensively store voltage signals Vo from respective pixels selected by the pixel selecting circuit 2. The image sensor thus constructed, however, has such a disadvantage that the power consumption is further increased for supplying electric current to a number of buffer amplifiers with one provided for each of the pixel outputs of one pixel line.

Thus, the conventional image sensor comprising a number of solid-state light sensitive elements arranged to form a matrix of pixels, which is capable of reading sensor signals from respective pixels in a time series by sequentially selecting pixel lines one at a time and sequentially selecting pixels one by one in a selected pixel line and then outputting each sensor signal as a voltage signal obtained by applying a bias voltage through the reference resistance and which, however, cannot achieve high speed reading of pixel signals because of its low signal driving ability.

The image sensor, which is further provided with bias circuits disposed for each of outputs of each pixel line for converting a voltage signal from each pixel by applying a bias voltage through a reference resistance so as to improve the signal driving ability necessary for achieving high-speed reading of pixel signals, has to supply electric energy to a number of reference resistances R provided one for each of the pixel outputs of one pixel line, resulting in a considerable increase in power consumption.

The image sensor comprising a matrix of solid-state light sensor elements each representing a unit pixel, which sequentially reads signals from respective pixels in a time series by sequentially selecting pixel lines one at a time and by sequentially selecting pixels in a selected pixel line and which is provided with a bias circuit for each of the pixel outputs of one pixel line to convert respective pixel signals to respective voltage signals by applying a bias voltage through a reference resistance and which is further provided with a buffer circuit comprising buffer amplifiers connected to each one of the signal output lines to temporally accumulate voltage signals of respective pixels from the bias circuits and selectively output the voltage signals so as to improve the signal driving ability and achieve high-speed scanning of respective sensor signals, has a disadvantage of further increasing power consumption by supplying electric current to a number of reference resistances and a number of buffer amplifiers disposed one for each of the pixel outputs of one pixel line.

SUMMARY OF THE INVENTION

An object of the present invention is to provide an image sensor comprising a matrix of a number of solid-state light sensor elements each representing a unit pixel and arranged to form a matrix of pixels, which is capable of reading out sensor signals in a time series by sequentially selecting pixel lines one by one and sequentially reading pixels from a selected line and which is featured by evenly dividing each line of pixels into a plurality of blocks, each block comprising the same specified number of pixels, and by using a first scanning means for sequentially reading out sensor signals on a block-by-block basis in an order starting from the first block, a second scanning means for sequentially reading out sensor signals on the pixel-by-pixel basis from the block readout by the first scanning means and a bias circuit for converting each of the sensor signals of the pixel block readout by the first scanning means into a voltage value by using a reference resistance with a bias voltage applied thereto. The image sensor thus constructed can realize reading out sensor signals of respective pixels in a time series at an increased speed with a minimum increase in power consumption.

Another object of the present invention is to provide an image sensor comprising a matrix of a number of solid-state light sensor elements each representing a unit pixel and arranged to form a matrix of pixels, which is capable of reading out sensor signals in a time series by sequentially selecting pixel lines one at a time and sequentially reading out pixels in a selected line and which is featured by evenly dividing each pixel line into a plurality of blocks, each block comprising the same specified number of pixels, and by using a first scanning means for sequentially reading out sensor signals on a block-by-block basis in an order starting from the first block, a buffer means for temporally storing sensor signals in each of the readout blocks and a second scanning means for sequentially reading out pixel signals stored in the buffer means. The image sensor thus constructed can realize reading out sensor signals of respective pixels in a time series at an increased speed with a minimum increase in power consumption.

PREFERRED EMBODIMENTS OF THE PRESENT INVENTION

Figure 7:
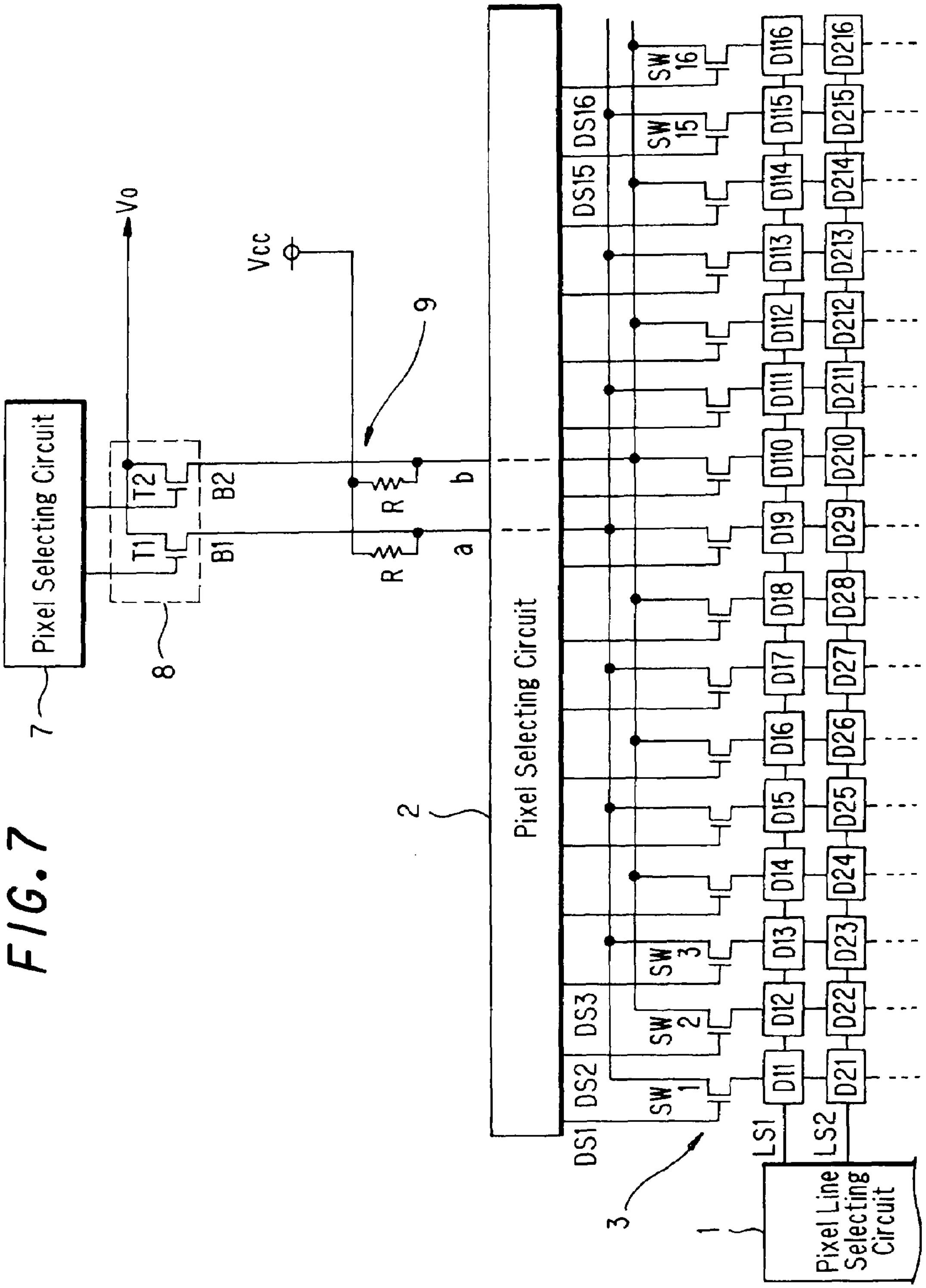
FIG. 7 is a block circuit diagram of an image sensor according to an embodiment of the present invention.

FIG. 7 illustrates an image sensor according to an embodiment of the present invention.

Figure 4:
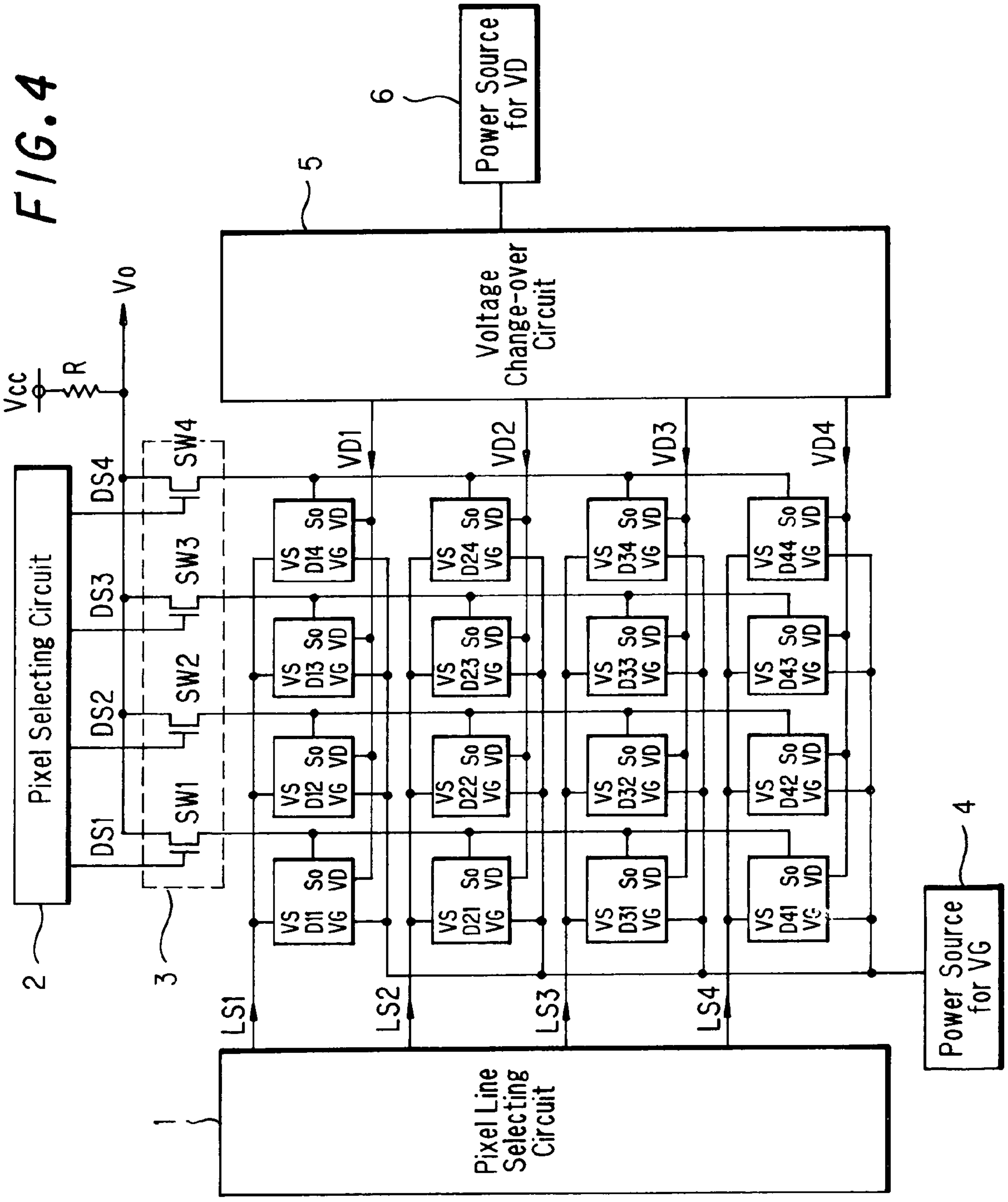
FIG. 4 is a block circuit diagram of a conventional image sensor using light sensor circuits each representing a unit pixel.
Figure 5:
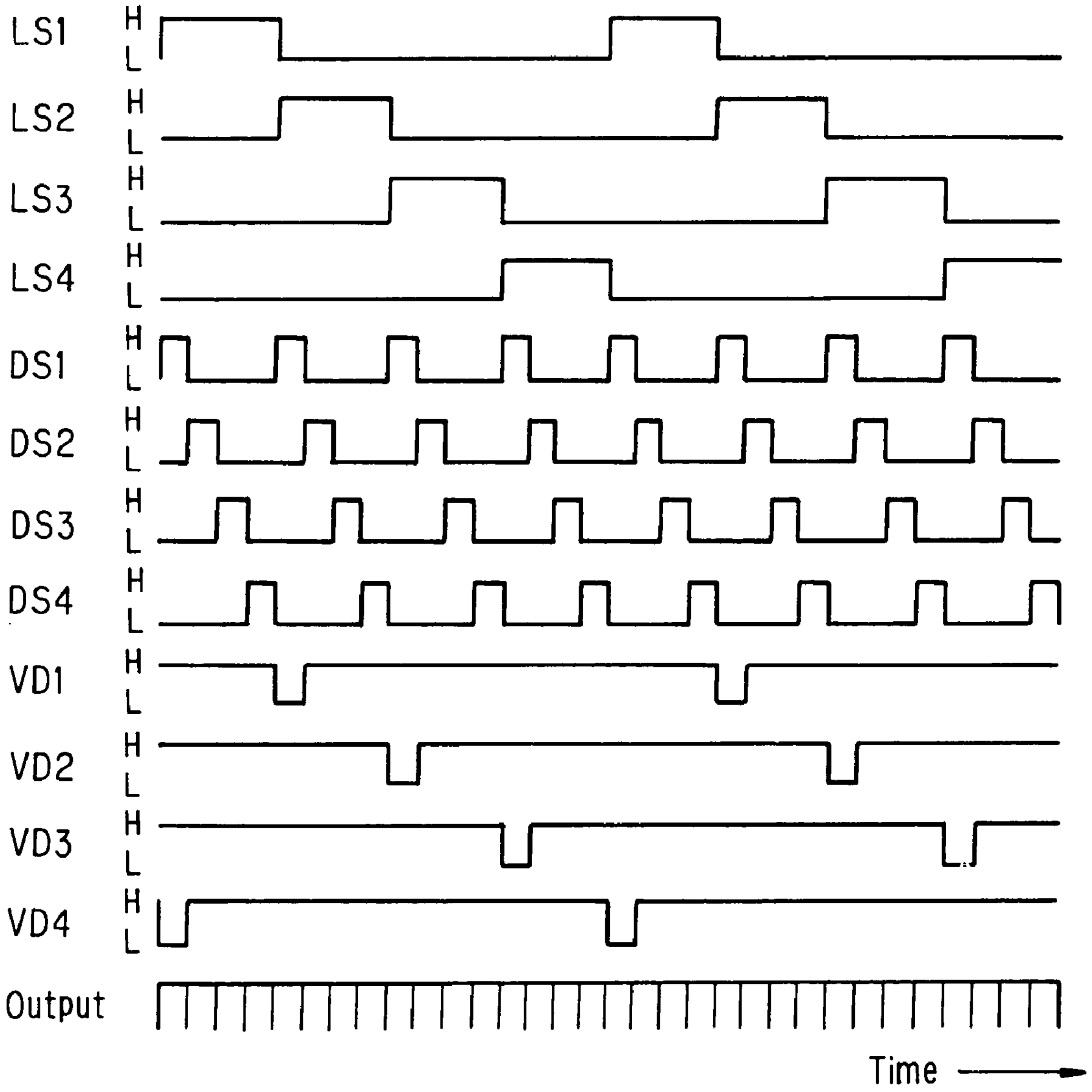
FIG. 5 is a time chart of signals generated at respective portions of the conventional image sensor of FIG. 4.
Figure 6:
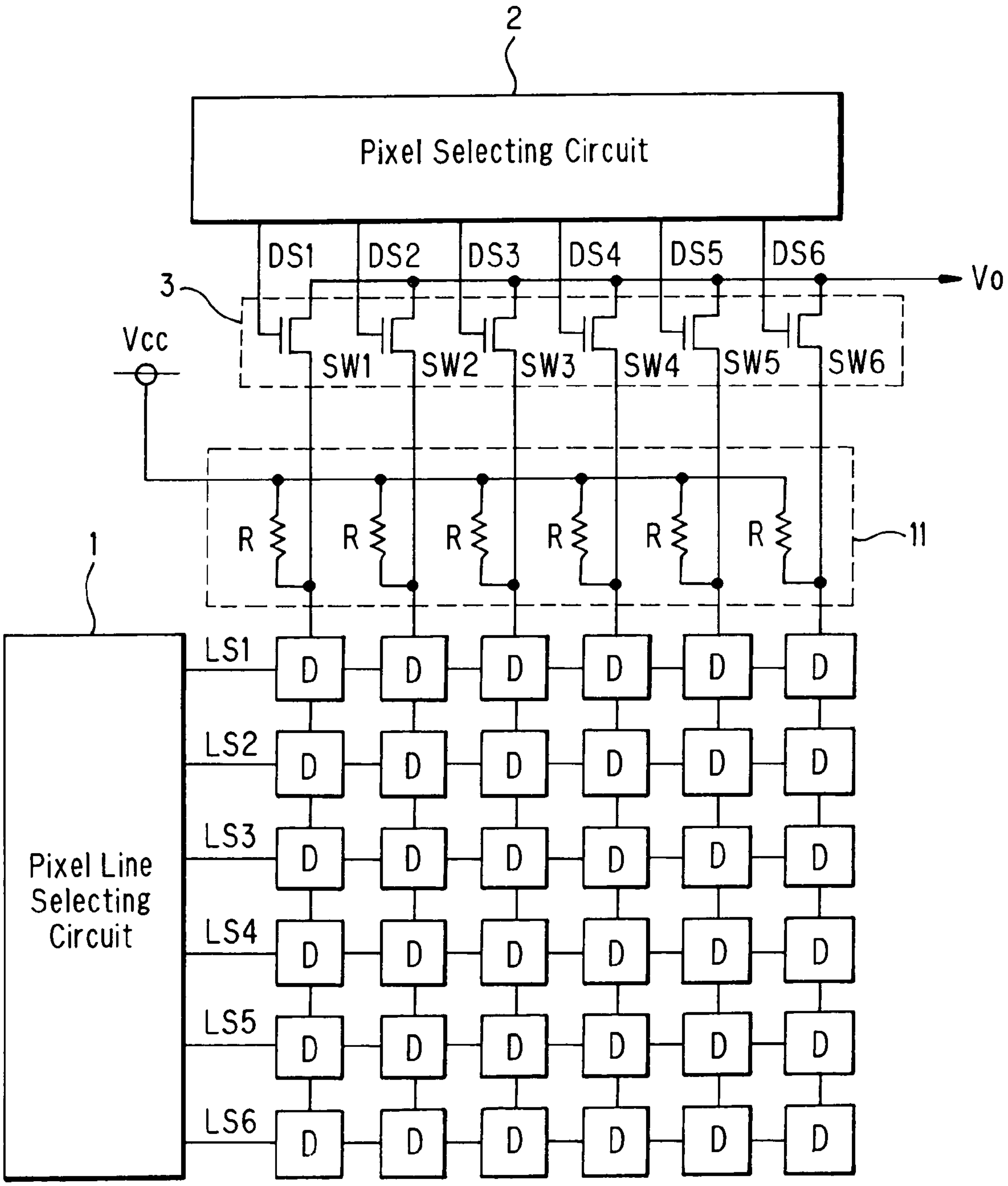
FIG. 6 is a block circuit diagram of another conventional image sensor using light sensor circuits each representing a unit pixel.

The image sensor is basically similar in construction to the conventional image sensor shown in FIG. 4, which comprises a matrix of light sensor circuits each representing a unit pixel and which is capable of reading out sensor signals in a time series by driving a pixel line selecting circuit 1 and a pixel selecting circuit 2 via switch circuits 3. In this embodiment, an array of pixels composing one pixel line consists of 16 pixels. Namely, the first line consists of 16 pixels D11 to D116 and the second line consists of 16 pixels D211 to D216. In this embodiment, one line of pixels are equally divided into 8 blocks each composed of two pixels, for example, combinations of D11 with D12, D13 with D14, . . . , D115 with D116. A common signal line "a" for the first (odd numbered) pixels (i.e., D11, D13, . . . , D115) in respective blocks and a common signal line "b" for the second (even numbered) pixels (i.e., D12, D14 , . . . , D116) in respective blocks are lead out as common sensor signal output lines. Common signal lines "a" and "b" are provided with a pixel selecting circuit 7 for sending signals for sequentially selecting sensor signals B1 and B2 of one block, a switch circuit 8 for sequentially turning ON analog switches T1 and T2 according to the selecting signals to output sensor signals B1 and B2 respectively and a bias circuit 9 for converting respective sensor signals from respective blocks into respective voltage values by a reference resistance R with a bias voltage Vcc applied thereto.

As the reference resistance R, a resistance load or a transistor load may be used. The bias circuit 9 may be omitted if sensor signals from respective pixels can be output as voltage signals.

Figure 8:
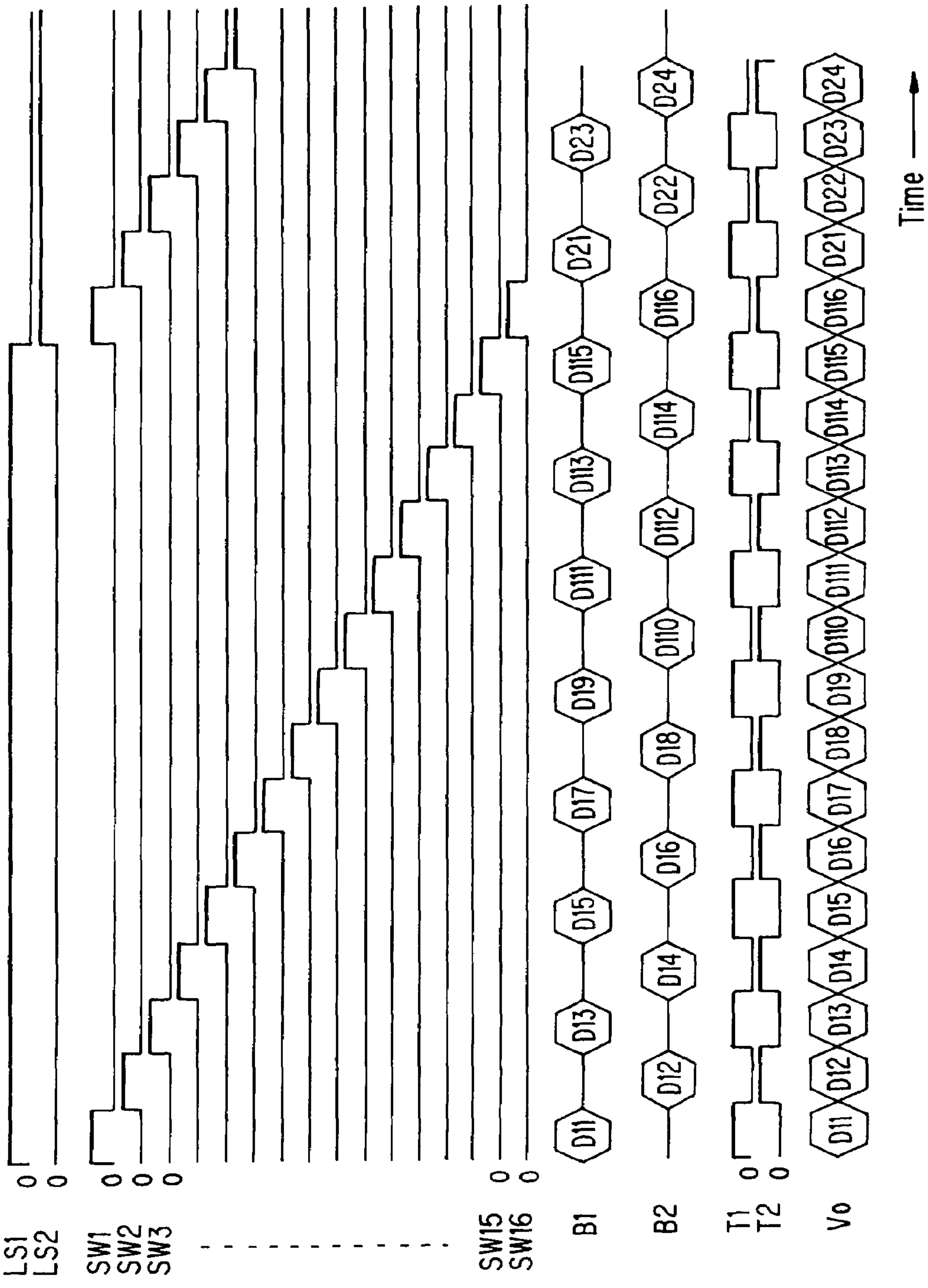
FIG. 8 is a time chart of signals generated at respective portions of the image sensor of FIG. 7 for showing an example of its operation.

FIG. 8 shows a time chart of signals produced at various portions of the image sensor of FIG. 7 while it operates.

A line of pixels D11~D116 is selected by a pixel line selecting signal LS1 and then analog switches SW1~SW16 are turned ON sequentially according to pixel selecting signals DS1~DS16, thereby sensor signals B1 from odd-numbered pixels (D11, D13, . . . , D115) are read out through a signal line "a" and sensor signals B2 from even-numbered pixels (D12, D14, . . . , D116) are read out through a signal line "b". The sensor signals B1 and B2 through the signal lines "a" and "b" are converted into respective voltage signals by a bias circuit 9 and then the sensor voltage signals Vo from respective pixels D11~D116 are output in a time series by alternately switching ON and OFF analog switches T1 and T2 according to pixel selecting signals from the pixel selecting circuit 7.

Figure 9:
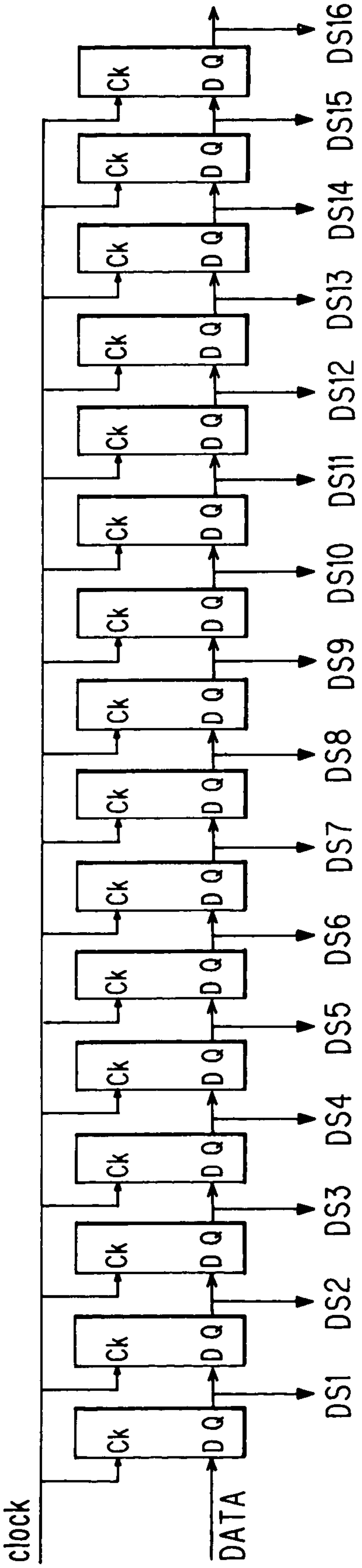
FIG. 9 is an exemplary circuit diagram of a shift register used for a pixel selecting circuit of the image sensor of FIG. 7.

FIG. 9 shows an exemplary configuration of a pixel selecting circuit 2 which uses a shift register. In this circuit, outputs DS1~DS16 of the register can sequentially turn ON analog switches SW1~SW16 only for the period of selecting respective pixels as shown in FIG. 8. The pixel selecting circuit 7 uses a shift register similar to that used for the pixel selecting circuit 2.

Figure 10:
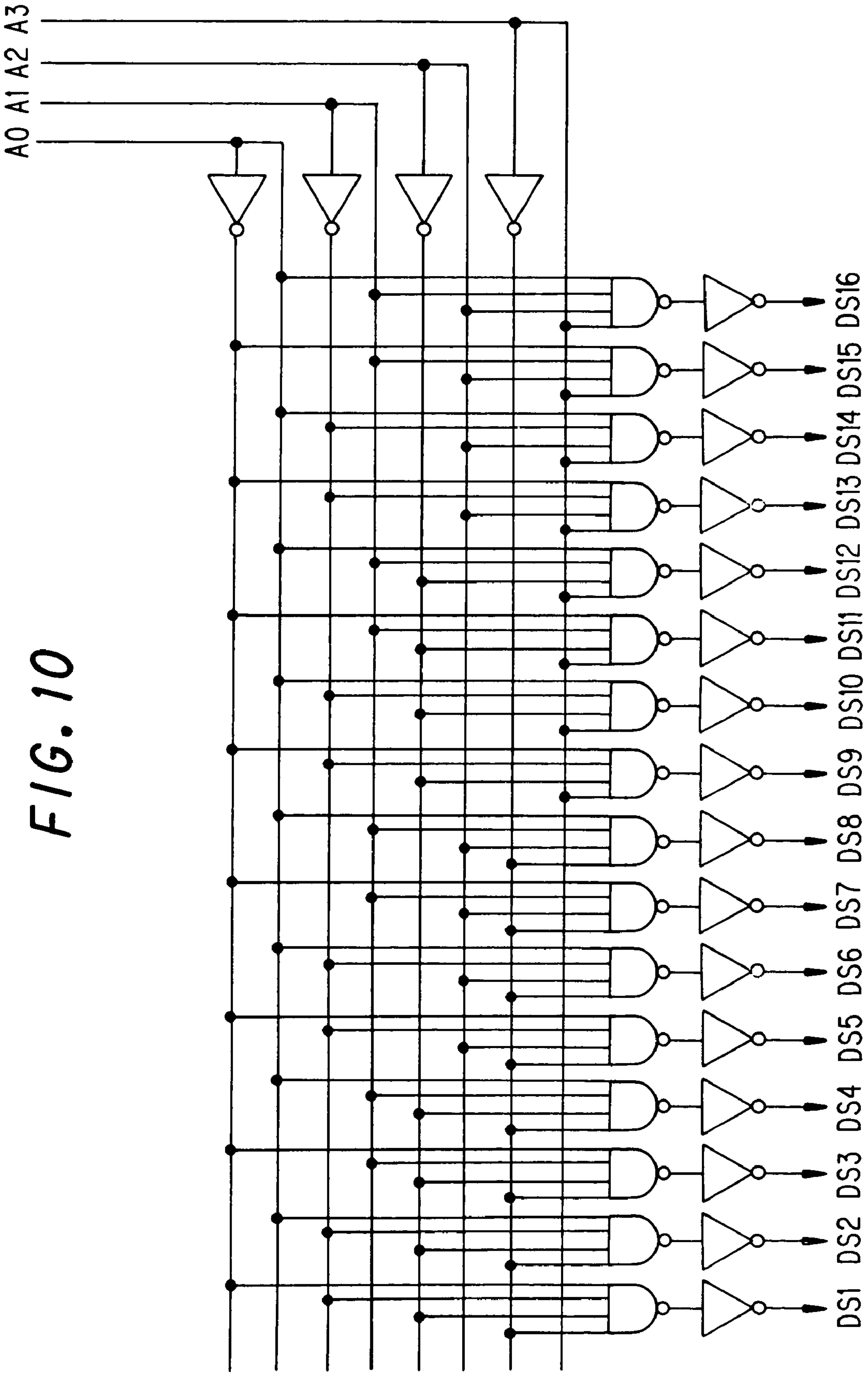
FIG. 10 is an exemplary circuit diagram of a decoder circuit used for a pixel selecting circuit of the image sensor of FIG. 7.

FIG. 10 shows an exemplary configuration of a pixel selecting circuit 2 which uses a decoder circuit. In this configuration, the decoder circuit generates outputs DS1~DS16 in response to input signals AO~A3 each of 4 bits, by which the analog switches SW1~SW16 can be sequentially turned ON only for a period of selecting respective pixels as shown in FIG. 8. A similar decoder circuit can be used for the pixel selecting circuit 7.

Figure 11:
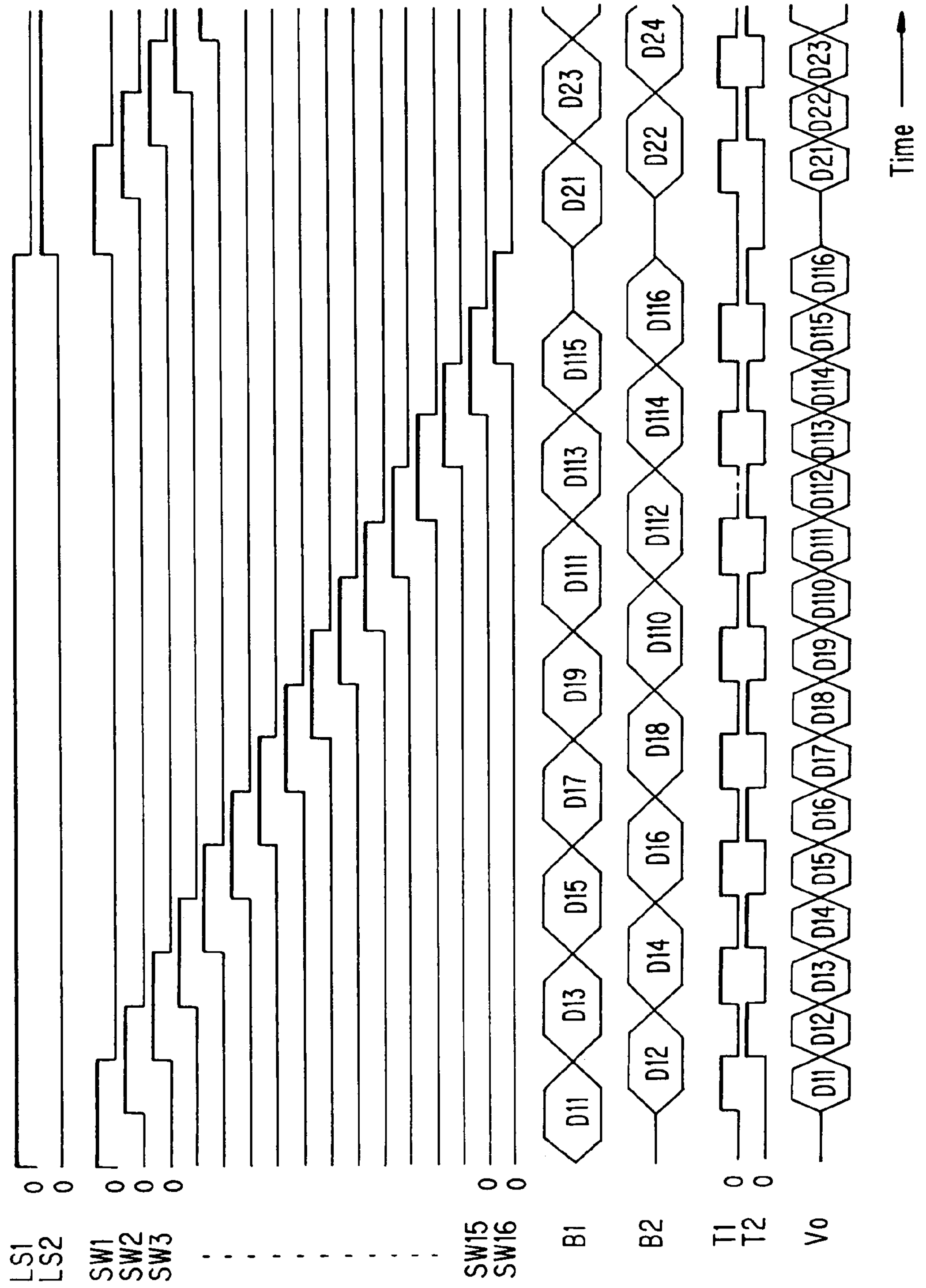
FIG. 11 is a time chart of signals generated at respective portions of the image sensor of FIG. 7 for showing another example of its operation.

FIG. 11 is a time chart of signals generated at respective portions of an image sensor of FIG. 7 during its operation.

In this case, a selecting signal (DS1~DS16) from a pixel selecting circuit 2 is maintained for a duration of selecting two pixels composing one block, thereby keeping each of the analog switches SW1~SW16 as in the ON state for that duration. Namely, the duration for turning on each of the analog switches SW1~SW16 is twice that in the operation of FIG. 8. This means that a sensor signal from each of respective pixels is stabilized for a period twice that in the operation of FIG. 8. If a stabilizing time for a sensor signal is the same, the scanning period in this case can be two times longer as compared with the case of FIG. 8.

Figure 12:
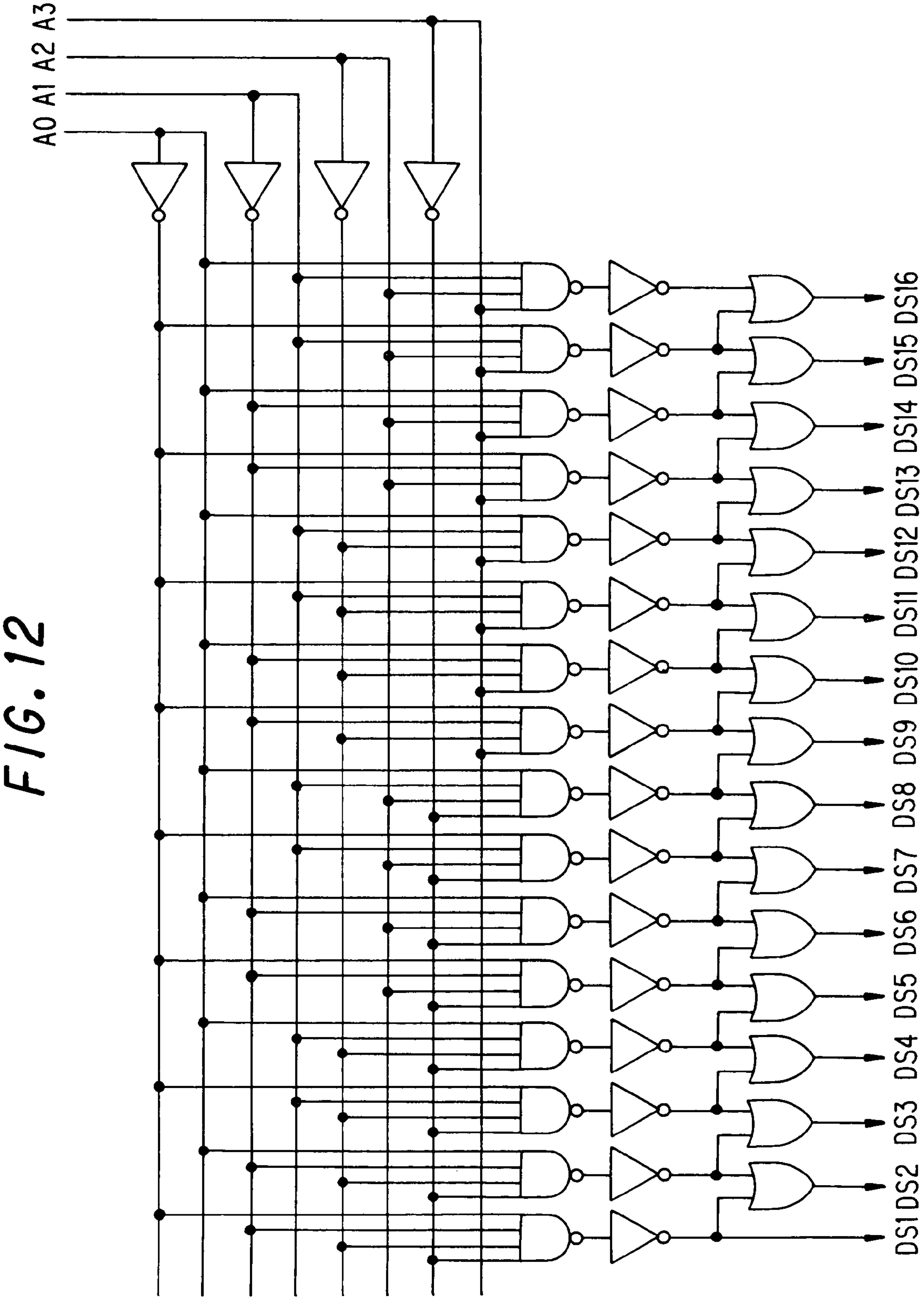
FIG. 12 is another exemplary circuit diagram of a decoder circuit used for a pixel selecting circuit of the image sensor of FIG. 7.

FIG. 12 shows a decoder circuit used for the pixel selecting circuit 2. In this case, selecting signals DS1 and DS2, DS2 and DS3, . . . , DS15 and DS16 can be selected according to input 4-bit signals AO~A3 respectively.

If a shift register is used for the pixel selecting circuit 2 in this instance, the operation of switches SW1~SW16 as shown in FIG. 11 can be performed by adding "11" to respective "DATA" inputs.

Figure 13:
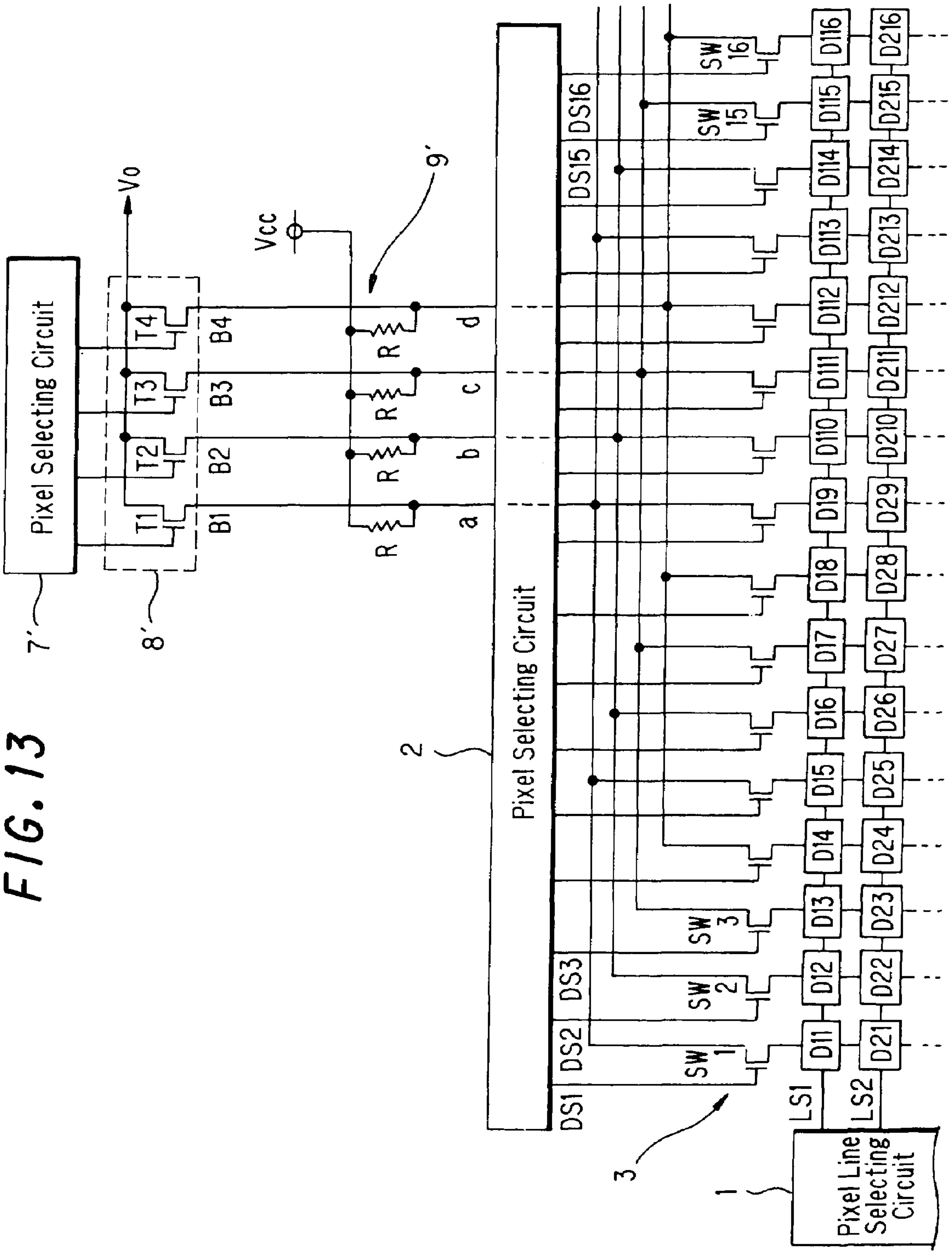
FIG. 13 is an image sensor according to another embodiment of the present invention.

FIG. 13 shows an image sensor according to another embodiment of the present invention. In this embodiment, one line of pixels is divided into 4 equivalent blocks each comprised of 4 pixels. These blocks have four (4) common signal lines "a", "b", "c" and "d", i. e., the signal line "a" is common to first pixels of the respective blocks, the signal line "b" is common to the second pixels of the respective blocks, the signal line "c" is common to the third pixels of the respective blocks and the signal line "d" is common to the fourth pixels of the respective blocks. A pixel selecting circuit 7' is provided for providing signals for sequentially selecting sensor signals B1, B2, B3 and B4 for one block and a switch circuit 8' is provided for outputting sensor signal B1, B2, B3 and B4 by sequentially turning ON analog switches T1, T2, T3 and T4 respectively. A bias voltage circuit 9' is also provided for converting respective sensor signals of one pixel block into respective voltage values by a reference resistance with a bias voltage Vcc applied thereto.

Figure 14:
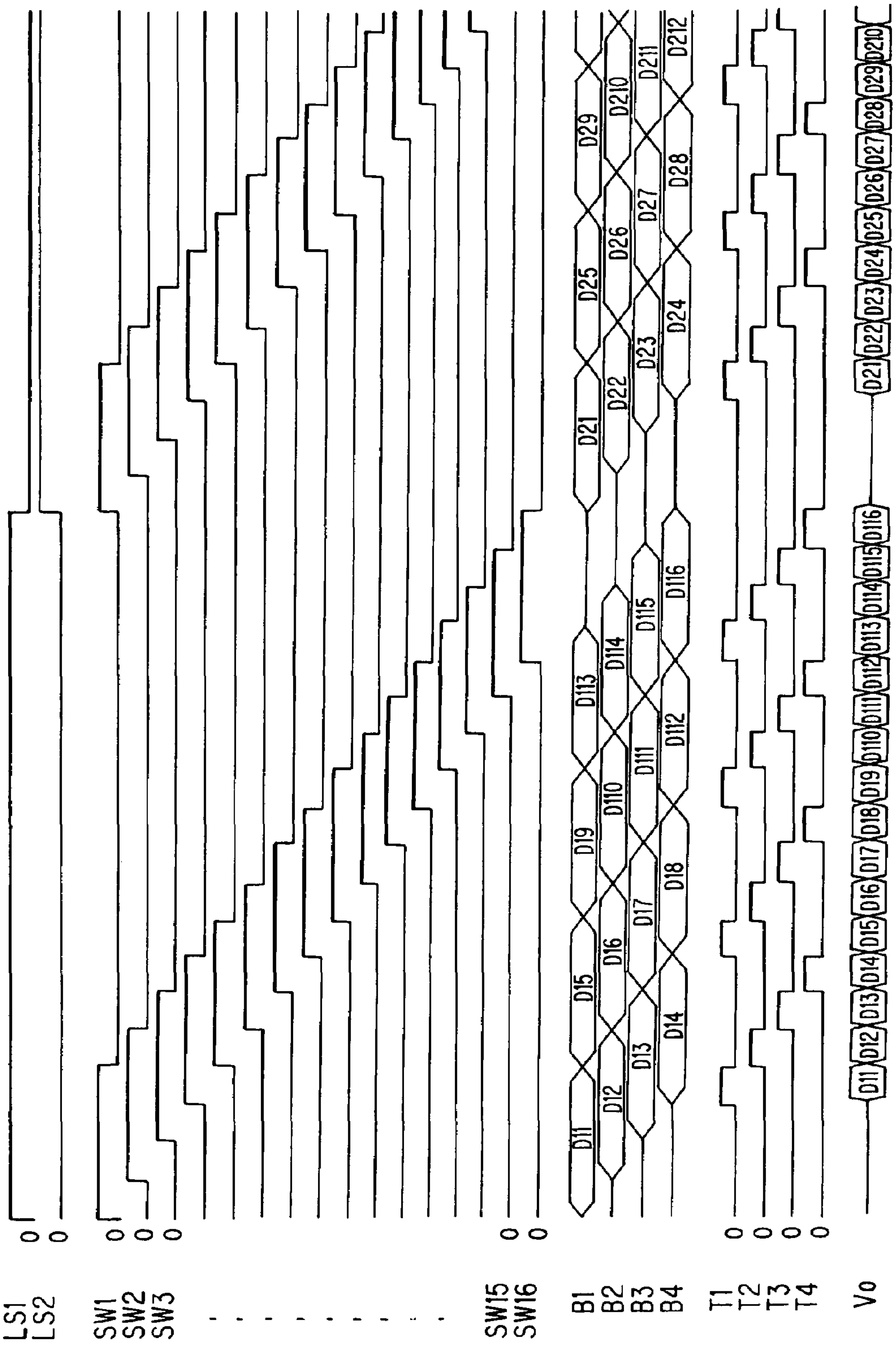
FIG. 14 is a time chart of signals generated at respective portions of the image sensor of FIG. 13 for showing an example of its operation.
Figure 15:
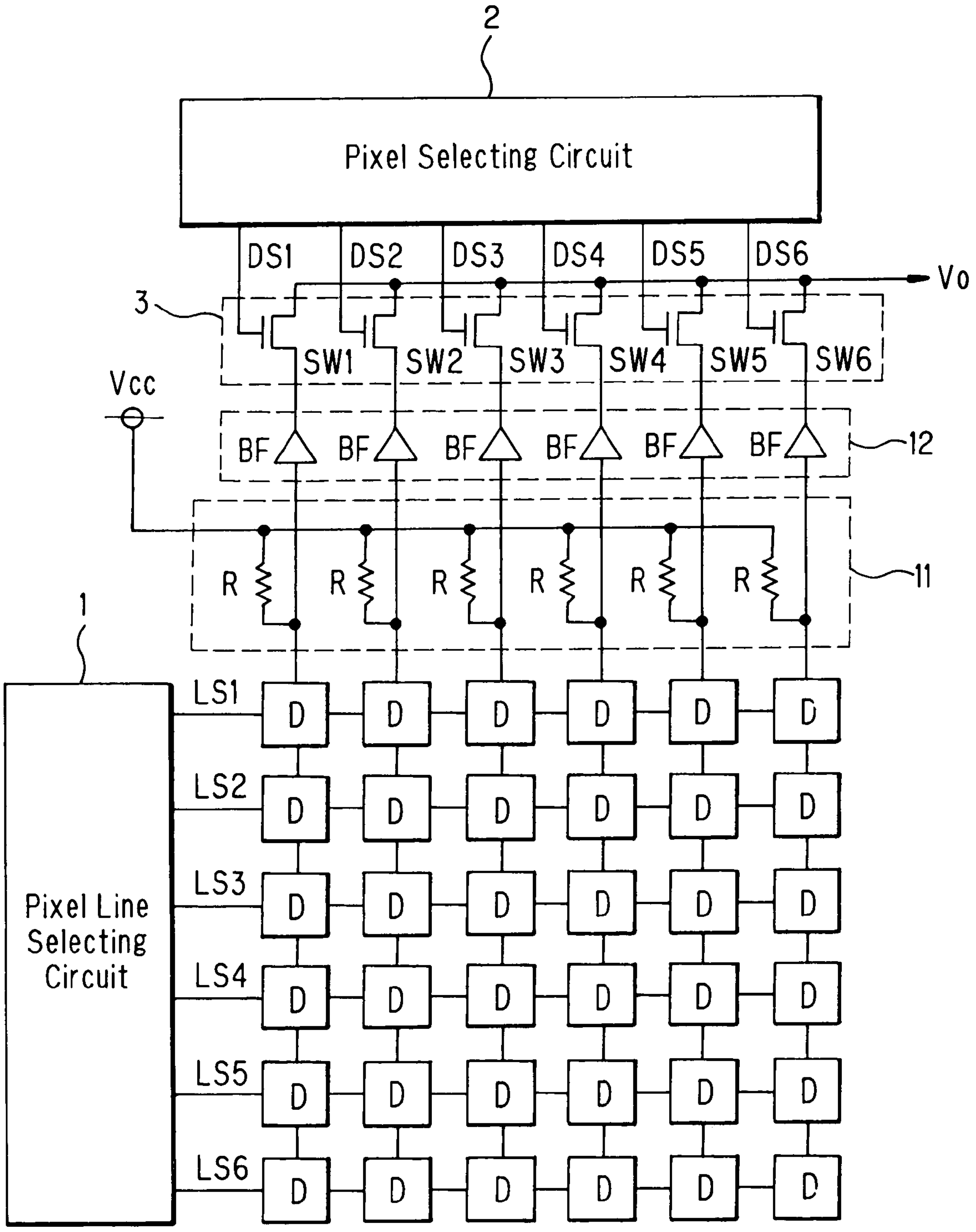
FIG. 15 is a block circuit diagram of still another conventional image sensor.

FIG. 14 is a time chart of generating signals at respective portions of an image sensor of FIG. 13, which shows an example of the operation of the image sensor.

Once a pixel line composed of pixels D11~D16 was selected by a pixel line selecting signal LS1, pixel selecting signals DS1~DS16 are sequentially generated to sequentially turn ON analog switches SW1~SW16. Sensor signals B1 from the first pixels (D11, D15, D19, D113) in respective blocks are sequentially read out through a signal line "a", sensor signals B2 from the second pixels (D12, D16, D110, D114) in respective blocks are sequentially read out through the signal line "b", sensor signals B3 from the third pixels (D13, D17, D111, D115) in respective blocks are sequentially read out through the signal line "c" and the sensor signals B4 from the fourth pixels (D14, D18, D112, D116) are sequentially read out through the signal line "d". The bias circuit 9' sequentially converts the sensor signals B1-B4 read out through respective signal lines "a"-"d" into respective voltage signals. The pixel selecting circuit 7 generates pixel selecting signals to sequentially turn ON and OFF analog switches T1-T4. Consequently, sensor signals Vo from the pixels D11 to D116 are output in a time series.

In this case, the pixel selecting circuit 2 maintains pixel selecting signals (DS1~DS16) each for a duration corresponding to a time for selecting four pixels of each block and analog switches SW1~SW16 are held in ON state for the same duration. Namely, in this instance, the analog switches are held in the ON-state for the duration 4 times longer than that in the operation of the image sensor as shown in FIG. 8. This means that it can take a 4-times longer time to stabilize each sensor signal read from each pixel. In other words, the scanning time for reading sensor signals from respective pixels can be 4 times longer than that in case of FIG. 8 if the stabilizing time is the same in both cases.

In case it takes 500 nS to saturate a sensor signal from each pixel, a bias circuit 9' provided for 4 signal lines "a"-"d" can reduce the time necessary for scanning one pixel to 31.25 nS (=500÷4).

Figure 16:
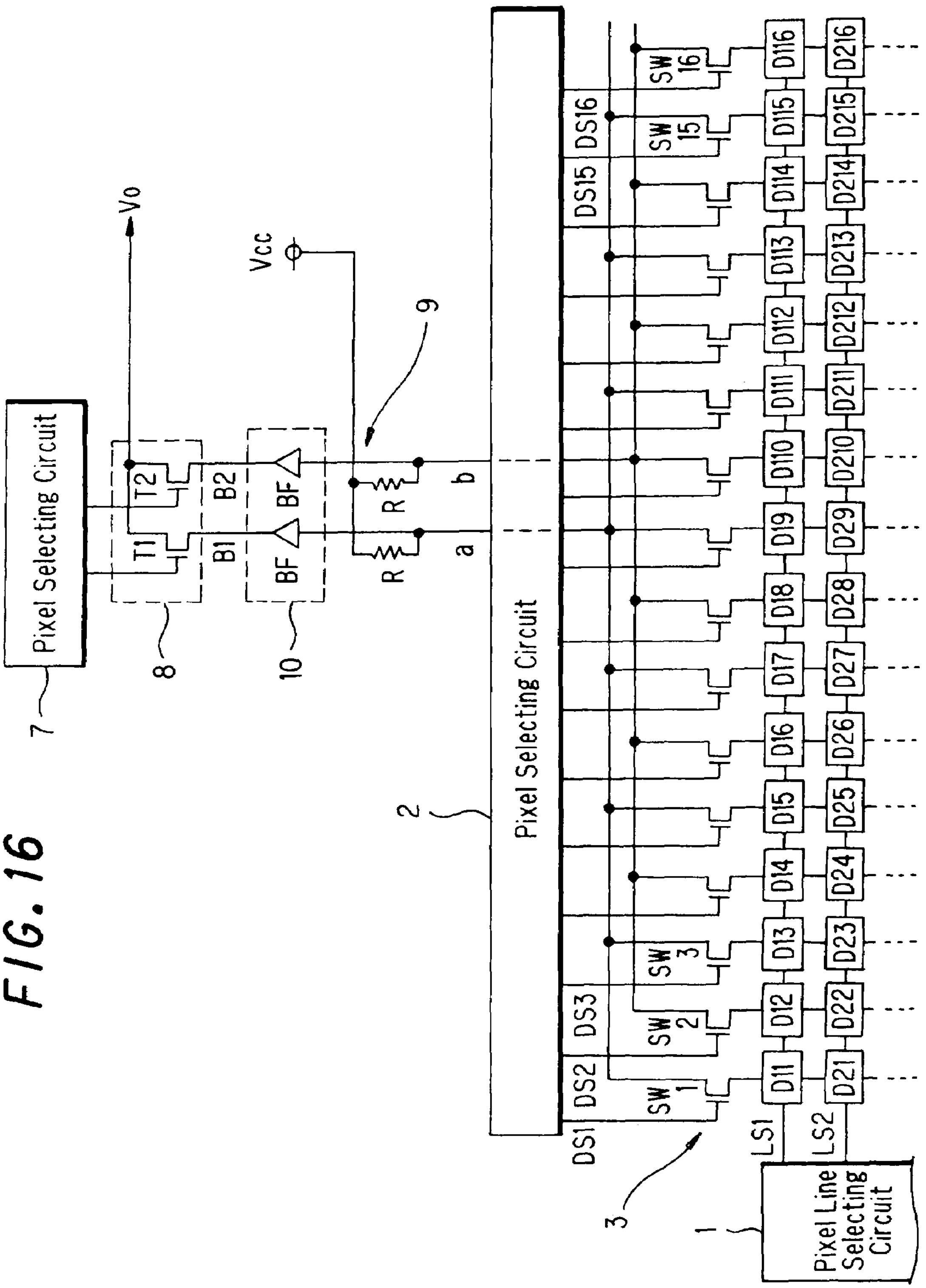
FIG. 16 is an image sensor according to a further embodiment of the present invention.

FIG. 16 shows an image sensor according to another embodiment of the present invention. In this embodiment, each of signal lines "a" and "b" is provided with a special buffer circuit 10 with a buffer amplifier BF connected thereto so as to temporally store therein voltage signals Vo read from respective pixels. The voltage signals are then sequentially output from the buffer circuit 10 by switching ON analog switches T1 and T2 respectively from the pixel selecting circuit 7.

The image sensor according to the shown embodiment can possess an increased signal driving ability enough to read out sensor signals at an increased scanning speed. The additional power consumption of the image sensor is also restricted to the minimum by providing a bias circuit 9 and a buffer circuit 10 only for signal lines "a" and "b" led from respective pixel blocks composing one pixel line.

The operation of the image sensor of FIG. 16 is basically similar to that described above by the time chart of FIG. 8 or 11.

Figure 17:
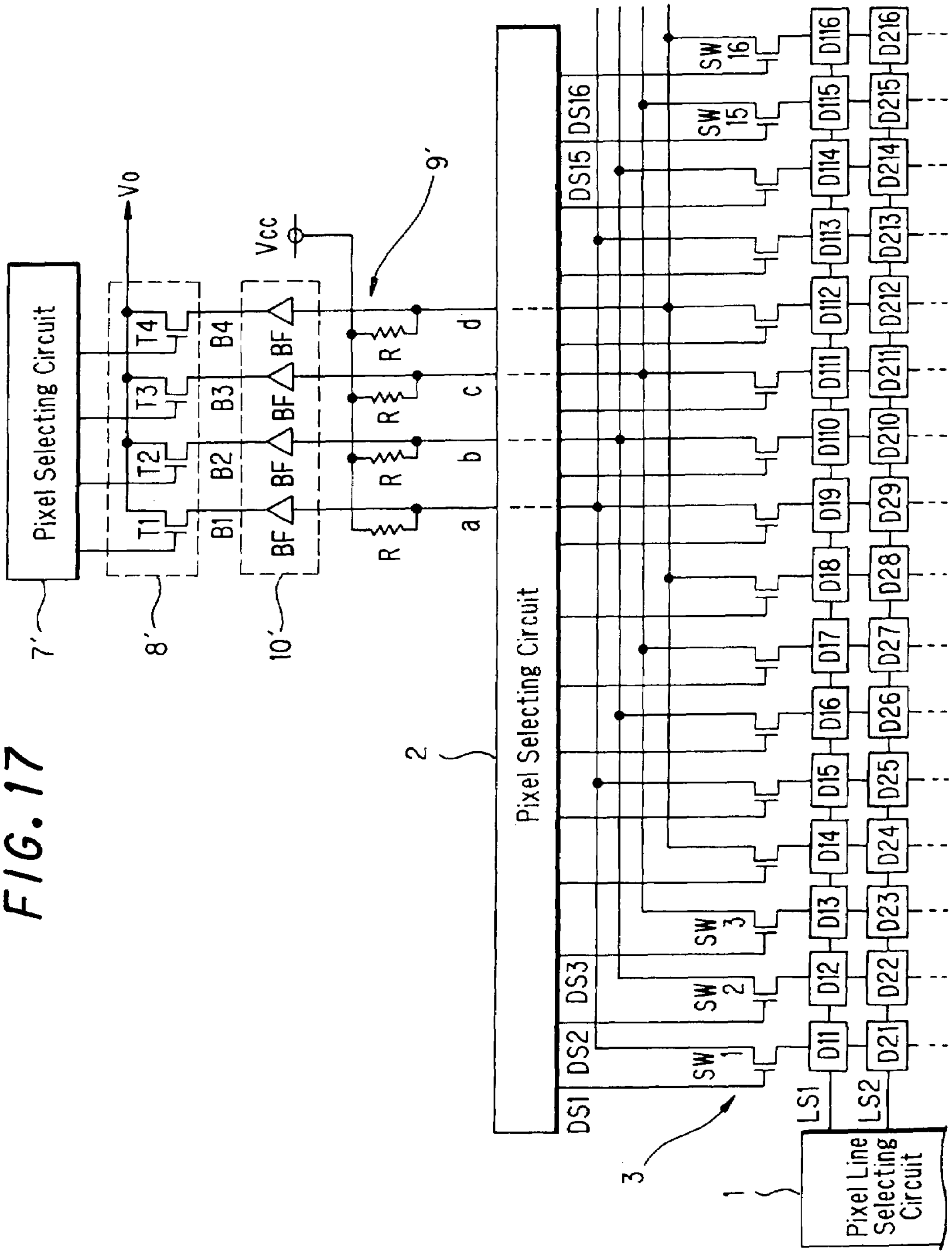
FIG. 17 is an image sensor according to a still further embodiment of the present invention.

FIG. 17 shows an image sensor according to another embodiment of the present invention.

In this embodiment, respective signal lines "a"-"d" are provided with a pixel selecting circuit 7' for generating signals for selecting sensor signals B1, B2, B3 and B4 in each pixel block, a switch circuit 8' for sequentially turning ON analog switches T1, T2, T3 and T4 to output sensor signals B1, B2, B3 and B4 according to the pixel selecting signals, a bias circuit 9' for converting respective sensor signals read from the block into respective voltage values Vo by a reference resistance with a bias voltage Vcc applied thereto and a buffer circuit 10' for temporally store respective sensor signals having specified voltage values.

The operation of the image sensor of FIG. 17 is basically similar to that described above with reference to the time chart of FIG. 14.

Figure 1:
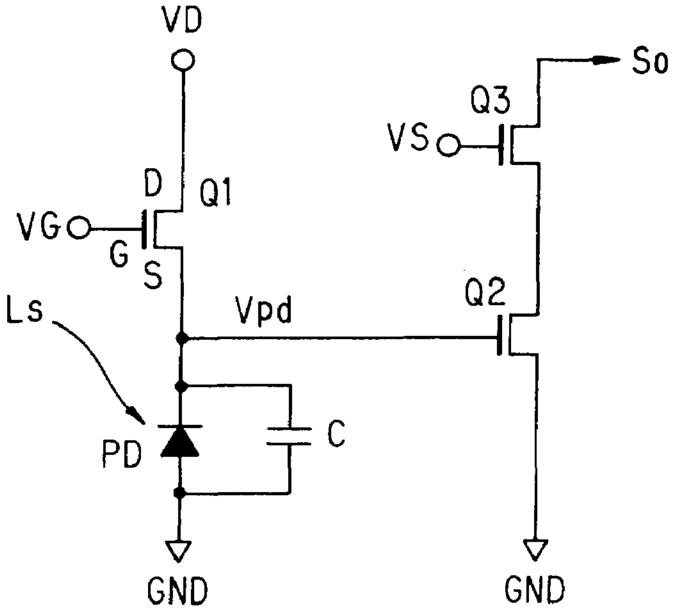
FIG. 1 is an electric circuit diagram of a light sensor circuit for one pixel, which is used as a unit component of an image sensor.
Figure 2:
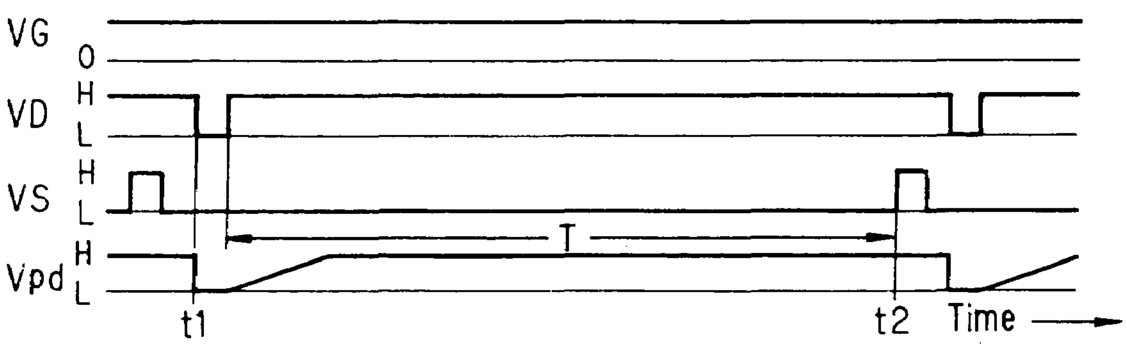
FIG. 2 is a time chart of signals to be generated in the light sensor circuit of FIG. 1.
Figure 3:
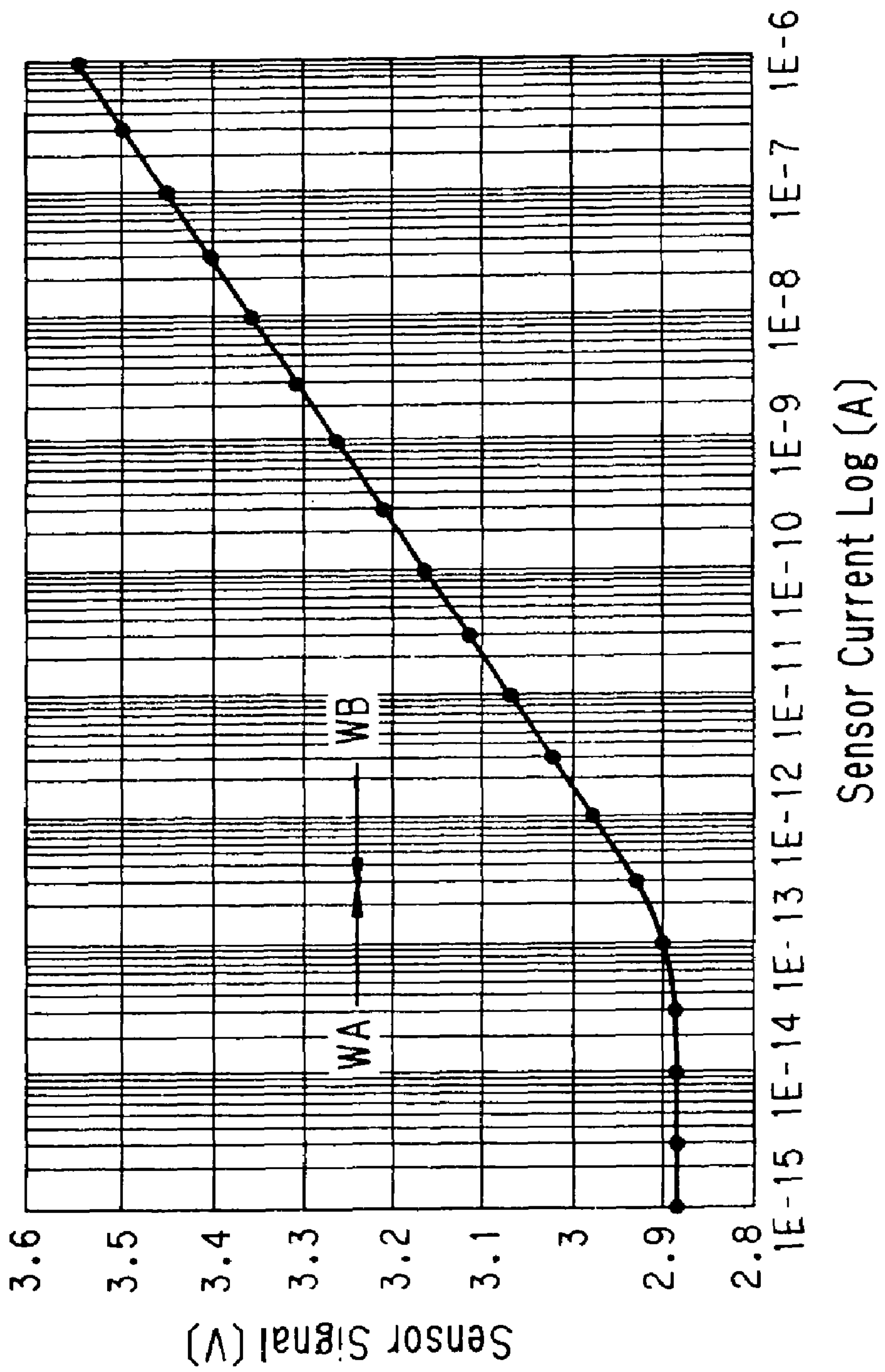
FIG. 3 shows an output characteristic of a sensor signal vs. a sensor current in the light sensor circuit of FIG. 1.

The image sensor according to the present invention can use as a unit pixel, besides a light sensor circuit shown in FIG. 1, any of solid-state light sensor elements, for example, a CCD or MOS transistor type sensor element.

INDUSTRIAL APPLICABILITY

An image sensor according to an embodiment of the present invention comprises a matrix of solid-state image sensor elements each representing a unit pixel and is capable of reading out in a time series sensor signals from respective pixels by sequentially selecting pixel lines one by one and sequentially selecting pixels from a selected pixel line, wherein each pixel line is evenly divided into a plurality of blocks each composed of the same specified number of pixels, a first scanning means sequentially reads sensor signals on a block-by-block basis in the order starting from the first block, a second scanning means sequentially reads out pixel sensor signals from a block readout by the first scanning means and a bias circuit converts a sensor signal readout by the first canning means into a voltage value by using a reference resistance with a bias voltage applied thereto. The image sensor thus constructed can achieve a high speed scanning of respective pixels with a minimal increase in its power consumption.

An image sensor according to another embodiment of the present invention comprises a matrix of solid-state image sensor elements each representing a unit pixel and is capable of reading out in a time series sensor signals from respective pixels by sequentially selecting pixel lines one by one and sequentially selecting pixels from a selected pixel line, wherein each pixel line is evenly divided into a plurality of blocks each comprised of the same specified number of pixels, a first scanning means sequentially reads sensor signals on a block-by-block basis in the order starting from the first block, a buffer means temporally stores sensor signals of the pixel block readout by the first scanning means and a second scanning means sequentially reads out the sensor signals stored in the buffer means. The image sensor thus constructed can achieve a high speed scanning of respective pixels with a minimal increase in its power consumption.

What is claimed:

1. An image sensor comprising a matrix of solid-state light sensor elements, each of which represents a unit pixel and is capable of reading out in a time series sensor signals of respective pixels by sequentially selecting pixel lines one by one and sequentially selecting sensor signals one by one in a selected pixel line, characterized in that each of the pixel lines is evenly divided into a plurality of blocks with each block composed of a specified number of pixels, a first scanning means is provided for sequentially reading out pixel sensor signals on a block-by-block basis starting from a first block, a buffer means is provided for temporally storing pixel sensor signals of a readout block, a second scanning means is provided for sequentially reading out pixel sensor signals on a pixel-by-pixel basis from a selected block and a bias circuit is provided for converting a pixel sensor signal scanned by the first scanning means into a voltage value by using a reference resistance with a bias voltage applied thereto, wherein the first scanning means comprises a pixel selecting circuit (2) for providing signals for sequentially selecting pixels on the line-by-line basis and a switch circuit (3) for outputting sensor signals according to the pixel selecting signals from the pixel selecting circuit, and the second scanning means comprises a pixel selecting circuit (7) for providing a signal for sequentially selecting pixels on the block-by-block basis and a switch circuit (8) for outputting sensor signals according to the pixel selecting signals from the pixel selecting circuit.

2. An image sensor as defined in claim 1, characterized in that the pixel selecting circuits of the first scanning means and the second scanning means are composed each of a shift register circuit or a decoder circuit.

3. An image sensor as defined in claim 1, characterized in that the duration of a pixel selecting signal provided by the first scanning means corresponds to a time necessary for selecting pixels of one block.

4. An image sensor as defined in claim 1, characterized in that the solid-state light sensor element is a light sensor circuit which is capable of producing in a photoelectric converting element a sensor current proportional to the quantity of light falling thereon, converting the sensor current into a voltage signal by a transistor with a logarithmic output characteristic in a weak inverse state, and outputting a sensor signal corresponding to the voltage signal.

5. An image sensor as defined in claim 4, characterized in that the light sensor circuit is initialized before detecting light by removing an electric charge remaining in a parasitic capacitor of the photoelectric converting element by changing a drain voltage of a MOS type transistor having a logarithmic output characteristic in a weak inverse state lower than a normal working value.

6. A method of scanning the pixels of an image sensor comprised of a matrix of solid-state light sensor elements, each of which represents a unit pixel and is capable of reading out in a time series sensor signals of respective pixels by sequentially selecting pixel lines one by one and sequentially selecting sensor signals one by one in a selected pixel line, comprising the steps of dividing each of the pixel lines into a plurality of blocks with each block composed of a specified number of pixels, first scanning the pixels for sequentially reading out pixel sensor signals on a block-by-block basis starting from a first block, temporally storing the pixel sensor signals of a readout block, then scanning the pixels for sequentially reading out pixel sensor signals on a pixel-by-pixel basis from a selected block, and converting a pixel sensor signal scanned in the first scanning step into a voltage value by using a reference resistance with a bias voltage applied thereto, wherein the duration of a pixel selecting signal provided by the first scanning step corresponds to a time necessary for selecting pixels of one block, and the solid-state light sensor element is a light sensor circuit which is capable of producing in a photoelectric converting element a sensor current proportional to the quantity of light falling thereon, converting the sensor current into a voltage signal by a transistor with a logarithmic output characteristic in a weak inverse state, and outputting a sensor signal corresponding to the voltage signal.

7. A method as defined in claim 6, characterized in that the light sensor circuit is initialized before detecting light by removing an electric charge remaining in a parasitic capacitor of the photoelectric converting element by changing a drain voltage of a MOS type transistor having a logarithmic output characteristic in a weak inverse state lower than a normal working value.

* * * * *